(12) United States Patent
Yang et al.

(10) Patent No.: US 8,327,922 B2
(45) Date of Patent: Dec. 11, 2012

(54) HEAT SINK AND METHOD FOR MANUFACTURING THE SAME

(75) Inventors: Jian Yang, Shenzhen (CN); Jing Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 607 days.

(21) Appl. No.: 12/500,616

(22) Filed: Jul. 10, 2009

(65) Prior Publication Data

US 2010/0258269 A1    Oct. 14, 2010

(30) Foreign Application Priority Data

Apr. 13, 2009    (CN) .......................... 2009 1 0301533

(51) Int. Cl.
*F28F 7/00* (2006.01)
*H01L 23/467* (2006.01)
*H05K 7/20* (2006.01)

(52) U.S. Cl. ........ 165/80.3; 165/185; 165/121; 361/697

(58) Field of Classification Search .................. 165/121, 165/80.3, 185; 361/695, 697, 704
See application file for complete search history.

(56) References Cited

U.S. PATENT DOCUMENTS

| | | | |
|---|---|---|---|
| 2,287,056 A * | 6/1942 | Owens | 206/597 |
| 2,339,093 A * | 1/1944 | Metheny | 248/74.3 |
| 3,708,834 A * | 1/1973 | Anderson et al. | 24/279 |
| 4,295,574 A * | 10/1981 | Nakazima et al. | 220/2.1 A |
| 6,776,224 B1 * | 8/2004 | Chen | 165/80.3 |
| 6,883,592 B2 * | 4/2005 | Lee | 165/80.3 |
| 7,218,524 B2 * | 5/2007 | Yu et al. | 361/719 |
| 7,277,287 B2 * | 10/2007 | Chen et al. | 361/700 |
| 7,359,195 B2 * | 4/2008 | Lee | 361/697 |
| 7,532,473 B2 * | 5/2009 | Kuo | 361/697 |
| 7,660,123 B1 * | 2/2010 | Lin et al. | 361/710 |
| 7,688,586 B2 * | 3/2010 | Tomioka | 361/695 |
| 2003/0079861 A1 * | 5/2003 | Lee | 165/80.3 |
| 2006/0056159 A1 * | 3/2006 | Lee et al. | 361/709 |
| 2009/0095452 A1 * | 4/2009 | Kuo | 165/144 |

FOREIGN PATENT DOCUMENTS

WO    WO2007/112728    * 10/2007

* cited by examiner

*Primary Examiner* — Allen Flanigan
*Assistant Examiner* — Jason Thompson
(74) *Attorney, Agent, or Firm* — Altis Law Group, Inc.

(57) ABSTRACT

A heat sink comprises a plurality of individual plates. Each of the plates comprises a heat-dissipating portion and a binding portion connecting with the heat-dissipating portion. The binding portions are stacked together on each other to form a heat-absorbing portion. At least some of the heat-dissipating portions are bent at angles relative to the respective binding portions. At least a hoop encloses the heat-absorbing portion. A method of manufacturing the heat sink is also disclosed.

2 Claims, 6 Drawing Sheets

HEAT SINK AND METHOD FOR MANUFACTURING THE SAME

BACKGROUND

1. Technical Field

The disclosure relates to a heat sink and, more particularly, to a heat sink for dissipating heat generated by an electronic component and a method for manufacturing the heat sink.

2. Description of Related Art

With the increasing development of computer technology, electronic components such as central processing units (CPUs) of computers are being made to operate at higher operational speeds and to have greater functional capabilities. When an electronic component operates at a high speed, it frequently generates large amounts of heat. The heat must be quickly removed from the electronic component to prevent it from becoming unstable or being damaged. Typically, a heat sink is attached to an outer surface of the electronic component to absorb heat from the electronic component. The heat absorbed by the heat sink is then dissipated to ambient air.

A typical heat sink comprises a plurality of individual plates. Each of the plates has a binding portion and a heat-dissipating portion. The individual plates are stacked on each other at the binding portions to form a heat-absorbing portion for contacting the outer surface of the electronic component. A plurality of spacers are interleaved between the plates at the heat-absorbing portion. The plates with the spacers cooperatively define a plurality of extending holes at the heat-absorbing portion thereof. A plurality of rivets are riveted into the extending holes by a riveting device to bound the binding portions of the plates and the spacers together.

However, in the assembling process of the heat sink, it is unavoidable to produce assembling errors, for example, the extending holes of the plates cannot be in alignment with the rivets. When the riveting device begins to press the rivet, the rivet or the plates or both can be damaged, which results in a reduction of yield rate of manufacturing the conventional heat sink.

What is needed, therefore, is a heat sink and a method for manufacturing the heat sink which improves the yield rate of the manufacture of the heat sink.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
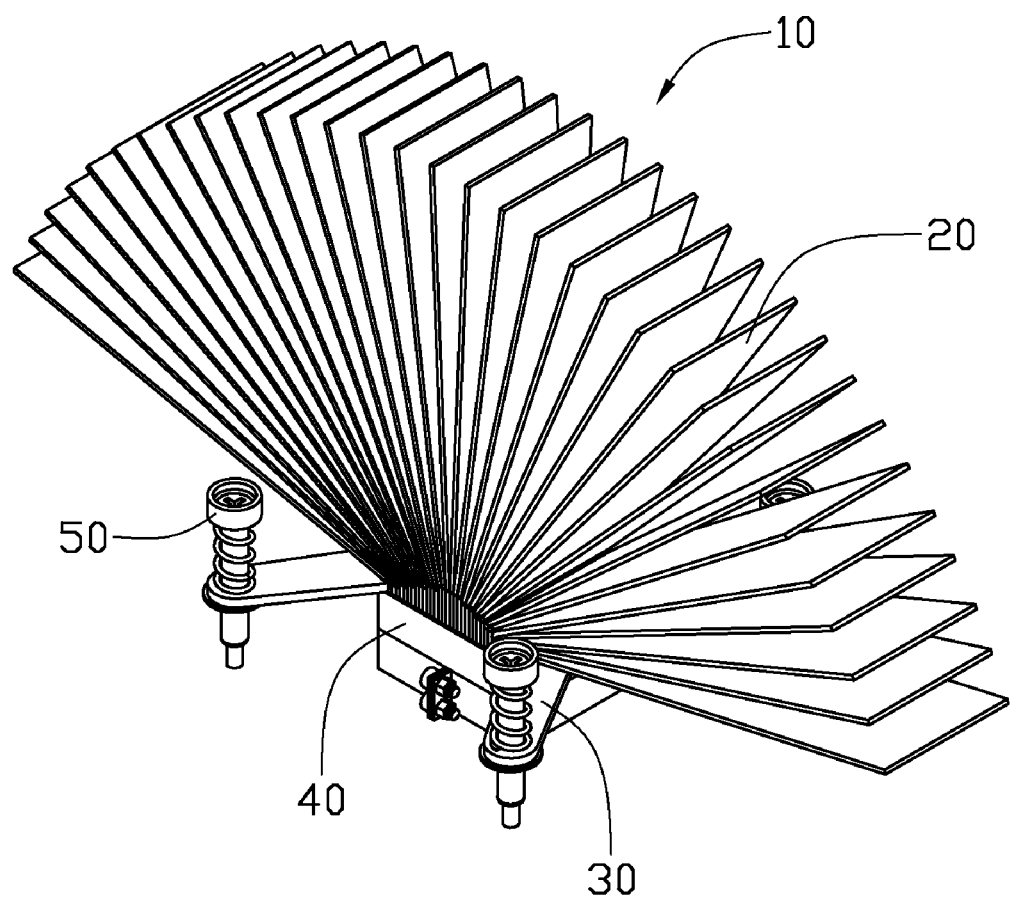
FIG. 1 is an isometric, assembled view of a heat sink in accordance with an embodiment of the disclosure.
Figure 2:
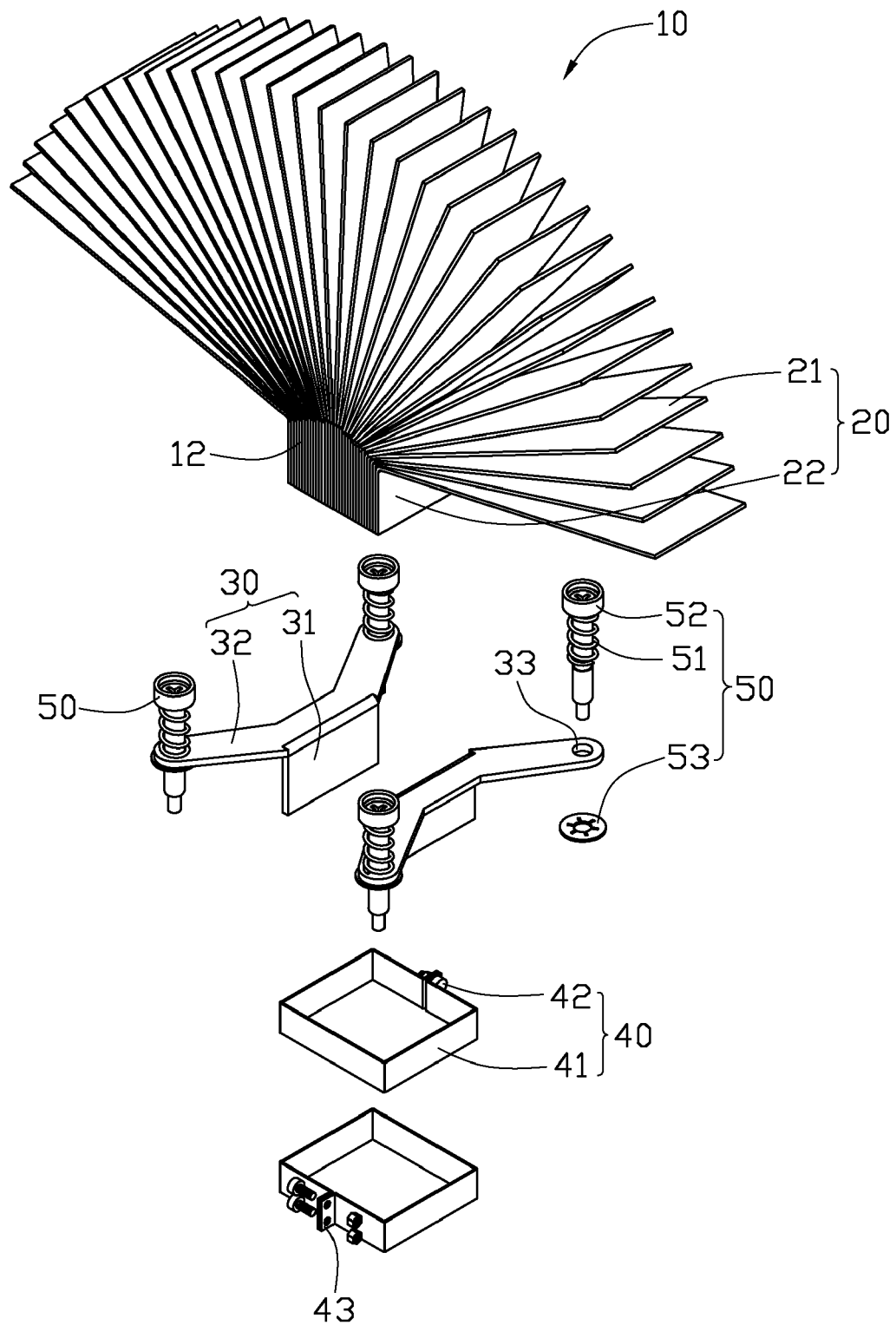
FIG. 2 is an isometric, exploded view of the heat sink of FIG. 1.
Figure 3:
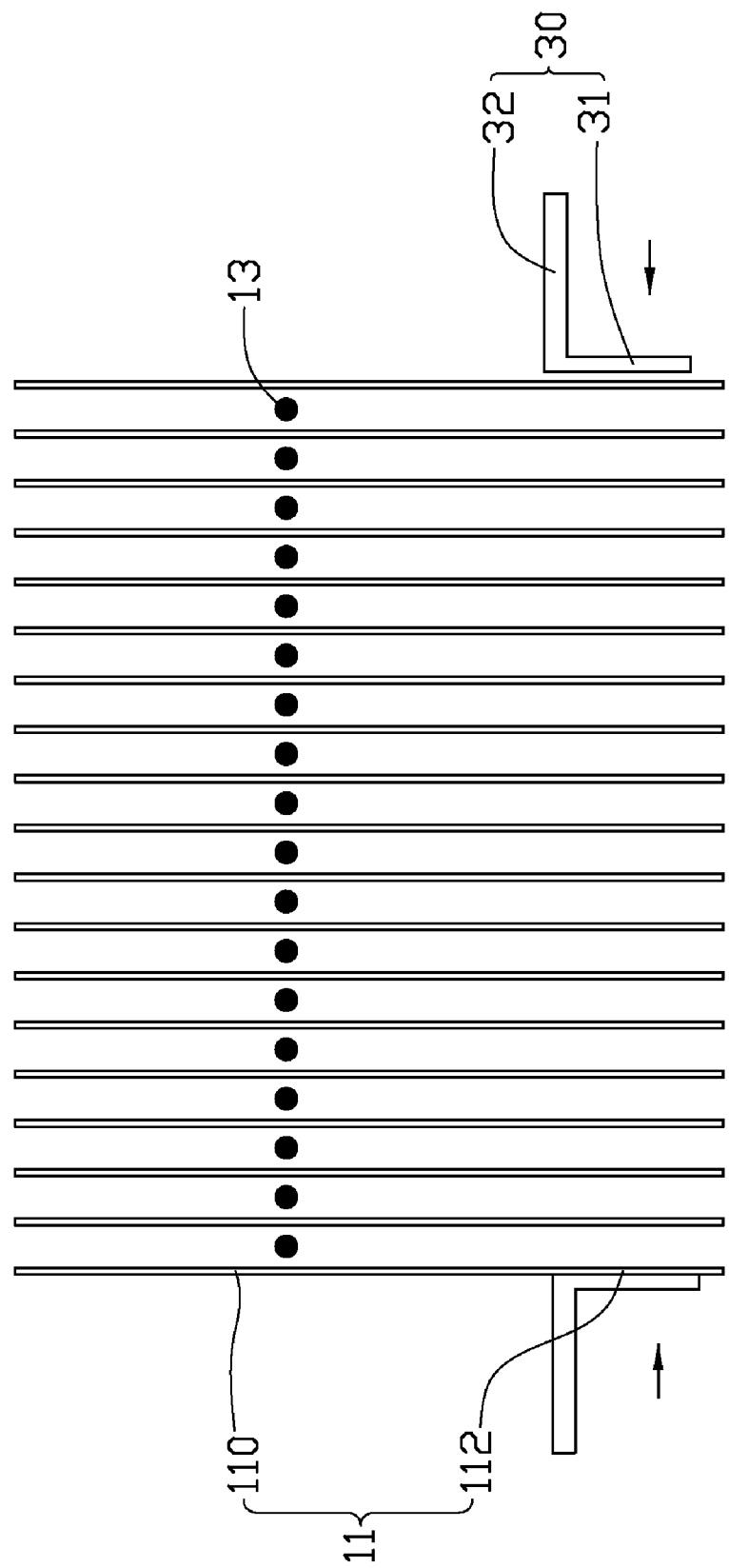
FIGS. 3-6 are schematic views of a manufacturing process of the heat sink of FIG. 1.
Figure 4:
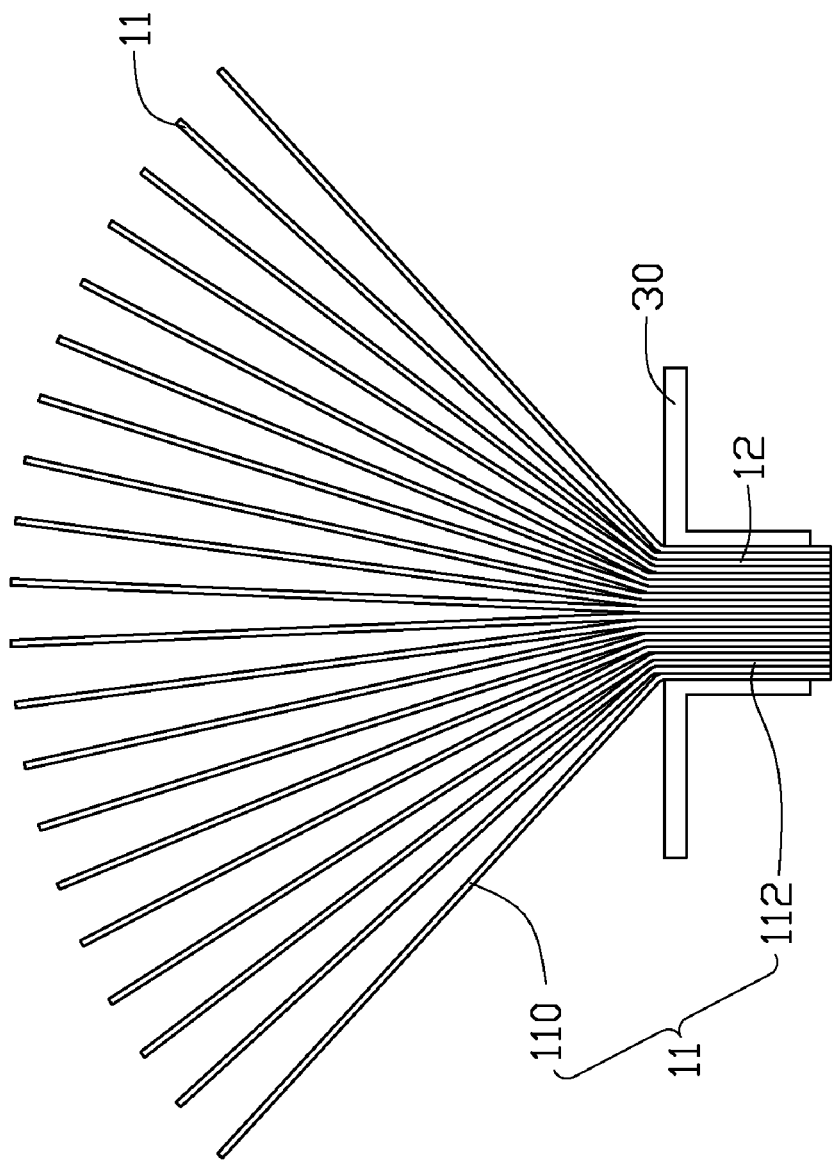
Figure 5:
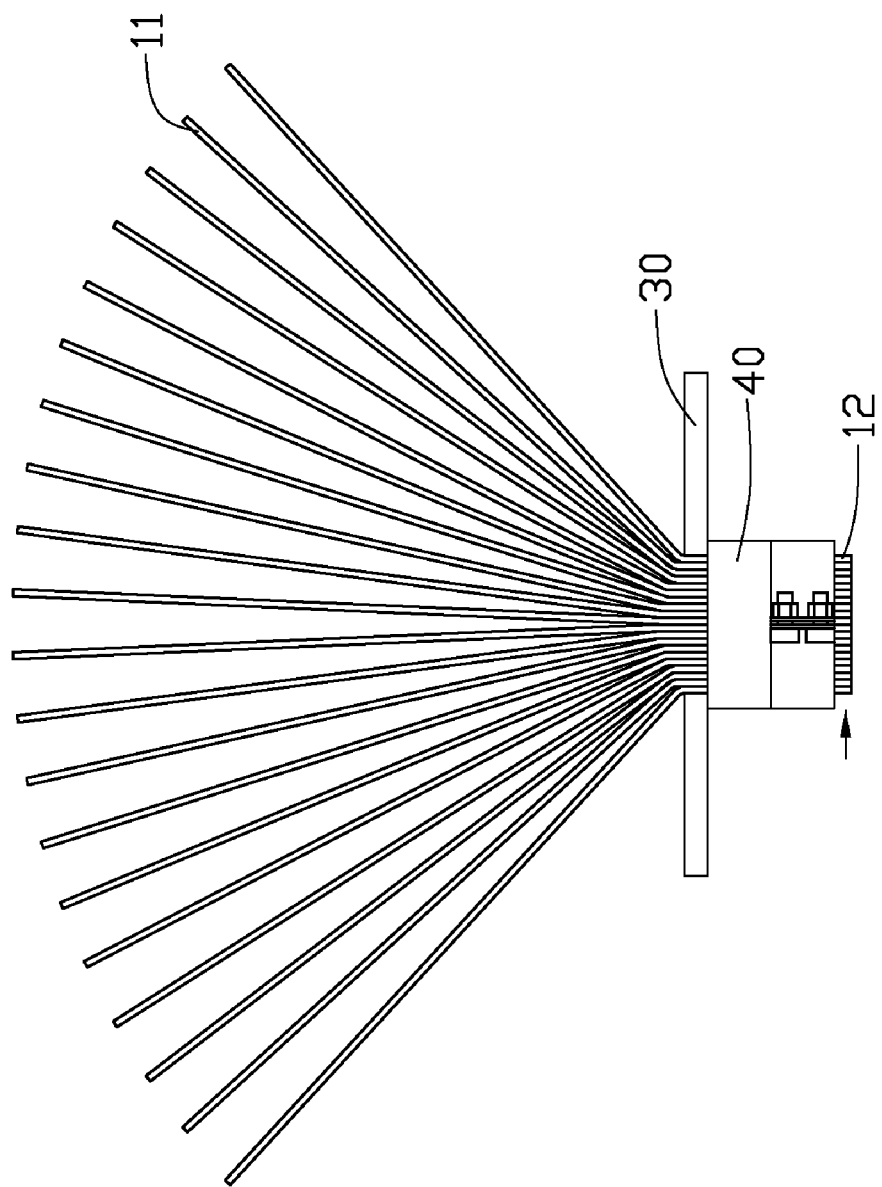
Figure 6:
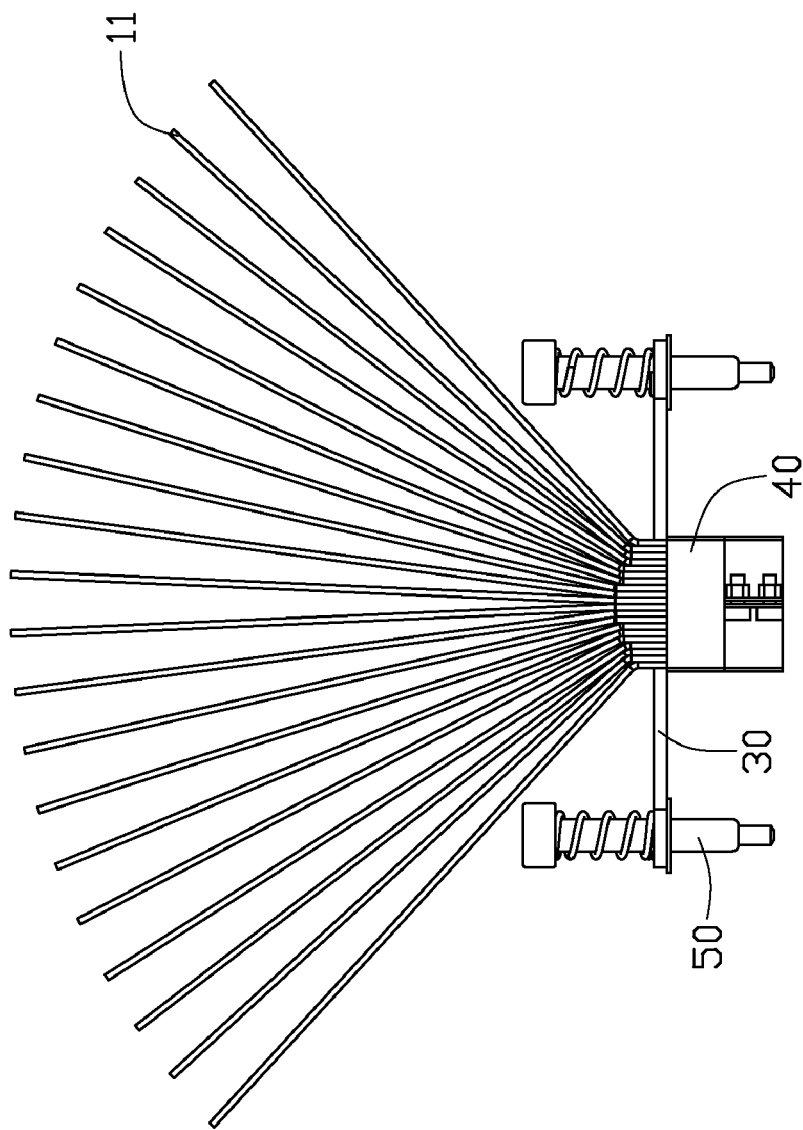

Referring to FIGS. 1-2, a heat sink 10 is illustrated in accordance with an embodiment of the disclosure. The heat sink 10 comprises a plurality of individual plates 20 having lower portions stacked on each other to form a heat-absorbing portion 12 and upper portions diverging from each other, two holders 30 attached to two opposite sides of the heat-absorbing portion 12, two hoops 40 securing the holders 30 to the heat-absorbing portion 12, and a plurality of fasteners 50 engaging with the holders 30.

The plates 20 are made of metal having a high thermal conductivity, such as copper or aluminum. Each of the plates 20 has a binding portion 22 and a heat-dissipating portion 21 integrally extending from the binding portion 22. The plates 20 are stacked together on each other at the binding portions 22 to form the heat-absorbing portion 12 for contacting an outer surface of an electronic component (not shown). The heat-dissipating portions 21 are bent at angles relative to the respective binding portions 22 of the plates 20 to increase distance between adjacent heat-dissipating portions 21, thereby defining a plurality of airflow passages therebetween. The heat-absorbing portion 12 has a flat surface in contact with the outer surface of the electronic component so as to absorb heat from the electronic component. The heat absorbed by the heat-absorbing portion 12 is then dissipated by the heat-dissipating portions 21 of the plates 20 to ambient air.

Each of the holders 30 comprises a contacting base 31 and two strip-like arms 32 extending outwardly and horizontally from a top end of the contacting base 31. Each of the arms 32 has a through hole 33 defined at a distal end thereof. The contacting bases 31 of the holders 30 are attached to the two opposite sides of the heat-absorbing portion 12, and the arms 32 extend beyond the heat-absorbing portion 12.

Each of the hoops 40 is made of metal having a high thermal conductivity. Each hoop 40 comprises a metal strip 41 and a retainer 42 connecting two opposite ends of the metal strip 41. The strip 41 is bent to have a rectangular configuration enclosing the contacting bases 31 of the holders 30 and the heat-absorbing portion 12, and has two mounting pieces 43 extending outwardly from the two opposite ends thereof. The retainer 42 extends through the mounting pieces 43 and locks them together for binding the contacting bases 31 tightly on the heat-absorbing portion 12. The hoops 40 enclose the contacting bases 31 and the heat-absorbing portion 12 therein.

Each of the fasteners 50 comprises a bolt 52 having a head at a top end thereof. A spring 51 and a retaining collar 53 are coiled around the bolt 52. The bolt 52 extends downwardly through the through hole 33 of a corresponding arm 32 of the holders 30. The spring 51 is sandwiched between the head of the bolt 52 and the corresponding arm 32. The retaining collar 53 is located under the corresponding arm 32 to snap the bolt 52 so as to preassemble the fastener 50 on the holder 30.

Referring to FIGS. 3-6, a method of manufacturing the heat sink 10 comprises the following steps:

1) incising a large plate to obtain a plurality of individual plates 11 having the same configuration and dimension, each of which comprises a heat-dissipating portion 110 and a binding portion 112 connecting with the heat-dissipating portion 110;

2) arranging the plates 11 in a row with two opposite ends thereof being aligned, wherein the plates 11 are parallel to and spaced from each other, and a distance between two adjacent plates 11 is equal to each other;

3) arranging a plurality of poles 13 in a row along a lateral direction of the plates 11 and correspondingly interleaving the poles 13 between the plates 11, and securing the poles 13 immovably to limit the heat-dissipating portions 110 of the plates 11 from moving along the lateral direction of the plates 11;

4) affording the above-mentioned two holders 30 having the contacting bases 31 thereof attached to the binding portions 112 of two outmost plates 11;

5) exerting a compressing pressure on the contacting bases 31 and the binding portions 112 of the plates 11 to make the binding portions 112 move toward and stack on each other to thereby form the heat-absorbing portion 12, wherein due to the block of the poles 13, the heat-dissipating portions 110 of the plates 11 are bent at angles relative to the respective binding portions 112, whereby the heat-dissipating portions 110 are divergent from each other;

6) coiling the above-mentioned two hoops 40 around a circumference of the heat-absorbing portion 12 and the contacting bases 31 of the holders 30 to secure the holders 30 on the heat-absorbing portion 12, wherein a bottom surface of the heat-absorbing portion 12 extends beyond the hoops 40.

7) milling the bottom surface of the heat-absorbing portion 12 by a milling machine to form a flat surface for being attached to the outer surface of the electronic component so as to absorb heat from the electronic component;

8) mounting the above-mentioned fasteners 50 on the arms 32 of the holders 30 whereby the heat-absorbing portion 12 of the heat sink 10 can be tightly attached to the electronic component.

Alternatively, in the manufacture of the heat sink 10, the compressing pressure can be firstly exerted on the binding portions 112 of the plates 11 to make them stack on each other to form the heat-absorbing portion 12, and then the holders 30 are attached on two opposite sides of the heat-absorbing portion 12.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat sink comprising:
   a plurality of individual plates, each of the plates comprising a heat-dissipating portion and a binding portion connecting with the heat-dissipating portion, the binding portions being stacked together on each other to form a heat-absorbing portion, and at least some of the heat-dissipating portions being bent at angles relative to the respective binding portions so that the heat-dissipating portions are divergent from each other;
   two holders each comprising a contacting base attached to one of two opposite sides of the heat-absorbing portion; and
   at least a hoop enclosing the heat-absorbing portion, wherein the at least a hoop encloses a circumference of the heat-absorbing portion and the contacting bases of the holders to secure the holders on the heat-absorbing portion; and
   wherein the at least a hoop comprises a strip and a retainer, the strip being bent to have a rectangular configuration enclosing the heat-absorbing portion, and two mounting pieces extending outwardly from the two opposite ends of the strip, the retainer extending through the mounting pieces and locking them together to bind the contacting bases on the heat-absorbing portion.

2. The heat sink as claimed in claim 1, wherein each of the hoops is made of metal.

* * * * *